US012794456B2

(12) United States Patent
Taylor

(10) Patent No.: US 12,794,456 B2
(45) Date of Patent: Nov. 10, 2026

(54) LATCH CIRCUIT WITH REDUCED PROPAGATION DELAY

(71) Applicant: Micron Technology, Inc., Boise, ID (US)

(72) Inventor: Jennifer E. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 18/929,080

(22) Filed: Oct. 28, 2024

(65) Prior Publication Data

US 2025/0300640 A1 Sep. 25, 2025

Related U.S. Application Data

(60) Provisional application No. 63/568,114, filed on Mar. 21, 2024.

(51) Int. Cl.
*H03K 3/356* (2006.01)
*G11C 11/4076* (2006.01)
(Continued)

(52) U.S. Cl.
CPC .... *H03K 3/356104* (2013.01); *G11C 11/4076* (2013.01); *G11C 11/4093* (2013.01); *H04L 25/03057* (2013.01)

(58) Field of Classification Search
None
See application file for complete search history.

(56) References Cited

U.S. PATENT DOCUMENTS 6,310,825 B1 * 10/2001 Furuyama ............ G11C 7/1072 365/194
8,610,466 B2 * 12/2013 Ding ................ H03K 3/356139 327/66

(Continued)

FOREIGN PATENT DOCUMENTS

CN 111034137 A * 4/2020 ............ H04L 25/03

OTHER PUBLICATIONS

Donnelly et al. "A 660 MB/s Interface Megacell Portable Circuit in 0.3 µm-0.7 µm CMOS ASIC." Dec. 1996. IEEE. IEEE Journal of Solid-State Circuits. vol. 31. pp. 1995-2003.*

(Continued)

*Primary Examiner* — Nathan Sadler
(74) *Attorney, Agent, or Firm* — Fletcher Yoder, P.C.

(57) ABSTRACT

This disclosure is directed to a latch circuit of a decision feedback equalizer (DFE). The latch circuit may sample (e.g., clock-in) each input data bit during a respective sampling time of each latch circuit operation cycle after a reduced propagation delay compared to other latch circuits. The latch circuit may have a reset time and a tracking time before each sampling time that may reduce the propagation delay of each data bit being received during the sampling time. During the track time, the latch circuit may combine (e.g., add, subtract) an offset voltage, generated based on based on one or more previously received data bits and/or characteristics of the latch circuit, with a baseline voltage of the latch circuit. The latch circuit may sense a logic level of each data bit being received during the sampling time based on detecting changes to the baseline voltage combined with the offset voltage.

20 Claims, 4 Drawing Sheets

(51) Int. Cl.

| | |
|---|---|
| ***G11C 11/4093*** | (2006.01) |
| ***H04L 25/03*** | (2006.01) |

(56) References Cited

U.S. PATENT DOCUMENTS

| | | | | |
|---|---|---|---|---|
| 10,147,466 | B1 | 12/2018 | Taylor et al. | |
| 10,637,692 | B2 | 4/2020 | Taylor et al. | |
| 11,854,651 | B2 | 12/2023 | Taylor et al. | |
| 11,855,812 | B2 | 12/2023 | Taylor et al. | |
| 2008/0198916 | A1 * | 8/2008 | Zeng | H04L 25/03057 375/233 |
| 2016/0006418 | A1 | 1/2016 | Hwang | |
| 2018/0294999 | A1 | 10/2018 | Giovannini et al. | |
| 2019/0109587 | A1 | 4/2019 | Penney | |
| 2022/0141054 | A1 * | 5/2022 | Seong | H04L 25/03057 375/232 |
| 2022/0262413 | A1 | 8/2022 | Waldrop et al. | |
| 2023/0012066 | A1 * | 1/2023 | Gu | H04L 25/03146 |
| 2023/0023730 | A1 | 1/2023 | Lin | |

OTHER PUBLICATIONS

Bae et al. "A 40nm 7Gb/s/pin Single-ended Transceiver with Jitter and ISI Reduction Techniques for High-Speed DRAM Interface." 2010. IEEE. 2010 Symposium on VLSI Circuits. pp. 193-194.*

Lee et al. "Energy-Efficient Dynamic Comparator with Active Inductor for Receiver of Memory Interfaces." Jul. 2018. ISLPED '18.*

Translation of CN-111034137-A. 2026.*

Rie et al., "A 40-Gb/s/pin Low-Voltage POD Single-Ended PAM-4 Transceiver with Timing Calibrated Reset-less Slicer and Bidirectional T-Coil for GDDR7 Application," 2022 Symposium on VLSI Technology & Circuits Digest of Technical Papers, 2 Pages.

Schinkel et al., "A Double-Tail Latch-Type Voltage Sense Amplifier with 18ps Setup+Hold Time," 2007 IEEE11 Internaionl Solid-State Circuits Conference / Session 17 / Analog Techniques and PLLs /17.7, 3 Pages.

Behzad Razavi, "The Design of a Comparator," Fall 2020, IEEE Solid-State Circuits Magazine, 7 Pages.

International Search report & Written opinion for PCT Application No. PCT/US2024/056742, Mailed Mar. 17, 2025, 8 pages.

* cited by examiner

LATCH CIRCUIT WITH REDUCED PROPAGATION DELAY

CROSS-REFERENCE TO RELATED APPLICATIONS

This application claims priority to U.S. Provisional Application No. 63/568,114, filed Mar. 21, 2024, which is incorporated by reference herein in its entirety.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

The following relates generally to a data transceiver of a memory device. The data transceiver may provide received data to a memory array of the memory device for storage. If not compensated for, in some cases, a frequency of the data being received may be limited to a propagation delay of each data bit of the data through the data transceiver. As such, data transceivers with a reduced propagation delay may be desired.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION

Figure 1:
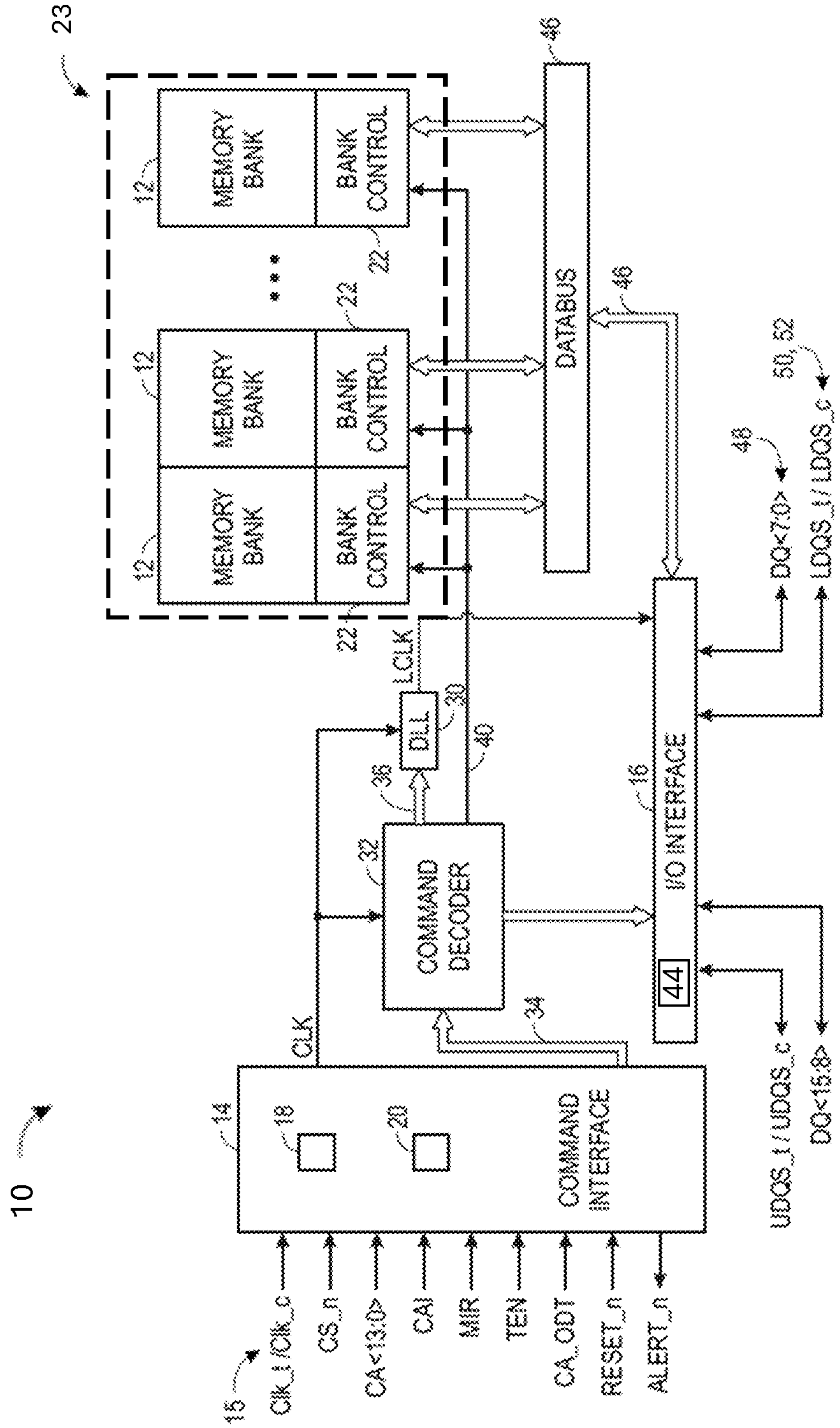
FIG. 1 is a block diagram of a memory device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to a latch circuit of a decision feedback equalizer (DFE) having a reduced data bit propagation delay compared to other latch circuits. The latch circuit may input write data for storage on a memory. The latch circuit may sample (e.g., clock-in) each data bit during a respective sampling time of each latch circuit operation cycle. The propagation delay of each data bit may be associated with a time for propagation of a voltage value of the respective data bit through the latch circuit. The latch circuit may sense each data bit being received after the delay for propagation of the respective data bit through the latch circuit during the respective sampling time. As such, a duration of the sampling time and/or the latch circuit operation cycle may be based on the propagation delay of each data bit through the latch circuit. Moreover, reducing the propagation delay of each data bit through the latch circuit may reduce the duration of the sampling time and/or the latch circuit operation cycle.

The latch circuit may have a tracking time before each sampling time to reduce the propagation delay of each data bit being received during the sampling time. The latch circuit may combine (e.g., add, subtract) an offset voltage with a baseline voltage of the latch circuit during the track time. The DFE may generate the offset voltage based on one or more previously received data bits and/or characteristics of the latch circuit. Moreover, the baseline voltage may have a logic level voltage associated with sensing the data bit by the latch circuit. The latch circuit may sense a logic level of each data bit being received during the sampling time based on detecting changes to the adjusted baseline voltage, as adjusted based on combining the offset voltage.

In particular, the offset voltage may be associated with an inter-symbol interference (ISI) or a distortion caused by the previously received data bits based on the characteristics of the latch circuit. If not compensated for, the ISI and/or the distortion may delay propagation of the voltage value of the data bit through the latch circuit. The latch circuit may adjust the baseline voltage based on the offset voltage during the track time to reduce propagation delay of the data bit through the latch circuit.

In some embodiments, the latch circuit may operate using a clock signal with a higher frequency compared to latch circuits of other DFEs. For example, the latch circuit may use the clock signal with a higher frequency by reducing a sampling time of each data bit during each latch circuit operation cycle based on the reduced propagation delay. Moreover, the latch circuit may have a reduced and/or adjustable tracking time compared to latch circuits of other DFEs. For example, the latch circuit may draw electrical current during the tracking time to adjust the baseline voltage based on the offset voltage. As such, in some embodiments, the latch circuit may consume reduced electrical power compared to latch circuits of other DFEs based on the reduced tracking time during each latch circuit operation cycle.

Turning now to the figures, FIG. 1 is a simplified block diagram illustrating certain features of a memory device 10, according to embodiments of the present disclosure. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 (CIC) and a command address input circuit 20 (CAIC), for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

In some embodiments, the memory device 10 may be disposed in (physically integrated into or otherwise connected to) a host device or otherwise coupled to a host device. The host may operate to transfer data to the memory device 10 for storage and may read data from the memory device 10 to perform various operations at the host. Accordingly, to facilitate these data transmissions, in some embodiments, the I/O interface 16 may include a data transceiver 44 that operates to receive and transmit data 48 to and from the I/O interface 16. The data transceiver 44 may include a distortion correction circuit including an equalizer, in particular, a decision feedback equalizer (DFE). The data transceiver 44 may couple to an external circuit providing the data 48.

Data may be sent to and from the memory device 10, utilizing the command and clocking signals discussed above, by transmitting and receiving the data 48 (e.g., DQ signals) through the I/O interface 16. More specifically, the data may be sent to or retrieved from the memory banks 12 over a data bus 46, which includes a plurality of bi-directional data buses. Data I/O signals, generally referred to as the data 48, are generally transmitted and received in one or more bi-directional data busses. For certain memory devices, such as a DDR5 SDRAM memory device, the data 48 may be divided into upper and lower bytes. For instance, for an ×16 memory device, the data 48 may be divided into upper and lower data 48 (e.g., DQ<15:8> and DQ<7:0>) corresponding to upper and lower bytes of the data signals, for instance.

To allow for higher data rates within the memory device 10, certain memory devices, such as DDR memory devices may utilize one or more external clock signals 50 and 52 (e.g., data strobe signals, DQS signals). The external clock signals 50 and 52, referred to hereinafter as the clock signals 50 and 52, are driven by the external processor or controller (e.g., the host) sending the data (e.g., for a write command) or by the memory device 10 (e.g., for a read command). For read commands, the data transceiver 44 may effectively use the clock signals 50 and/or 52 as additional data output signals (e.g., DQ signals) with a predetermined pattern.

For write commands, the data transceiver 44 may use the clock signals 50 and 52 to sample (e.g., clock-in) the corresponding input data 48. For certain memory devices, including but not limited to DDR5 SDRAM memory devices, the data transceiver 44 may receive in-phase clock signals 50 having a reference phase (e.g., 0 degrees) and quadrature clock signals 52 (e.g., out-of-phase clock signals) having a quadrature phase. The quadrature clock signals 52 may be 90 degrees (e.g., approximately 90 degrees) delayed compared to the in-phase clock signals 50. For example, the data transceiver 44 may sample the input data with a reduced propagation delay based on receiving the in-phase clock signals 50 and the quadrature clock signals 52 with the input data 48, as will be appreciated.

As with the clock signals (Clk_t and Clk_c), the clock signals 50 and/or 52 may be provided as a differential pair of data strobe signals (DQS_t and DQS_c) to provide differential pair signaling during reads and writes. For certain memory devices, such as a DDR5 SDRAM memory device, the differential pairs of clock signals 50 and/or 52 may be divided into upper and lower data strobe signals (e.g., UDQS_t and UDQS_c; LDQS_t and LDQS_c) corresponding to upper and lower bytes of data sent to and from the memory device 10, for instance.

Various other components such as power supply circuits (for receiving external supply voltages VDD and VSS), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

As mentioned above, in some embodiments, the memory device 10 may be disposed in (physically integrated into or otherwise connected to) the host device or otherwise coupled to the host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), Multimedia Media Cards (MMC's), Secure Digital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. The host may include many other components, depending on the application of the host.

Figure 2:
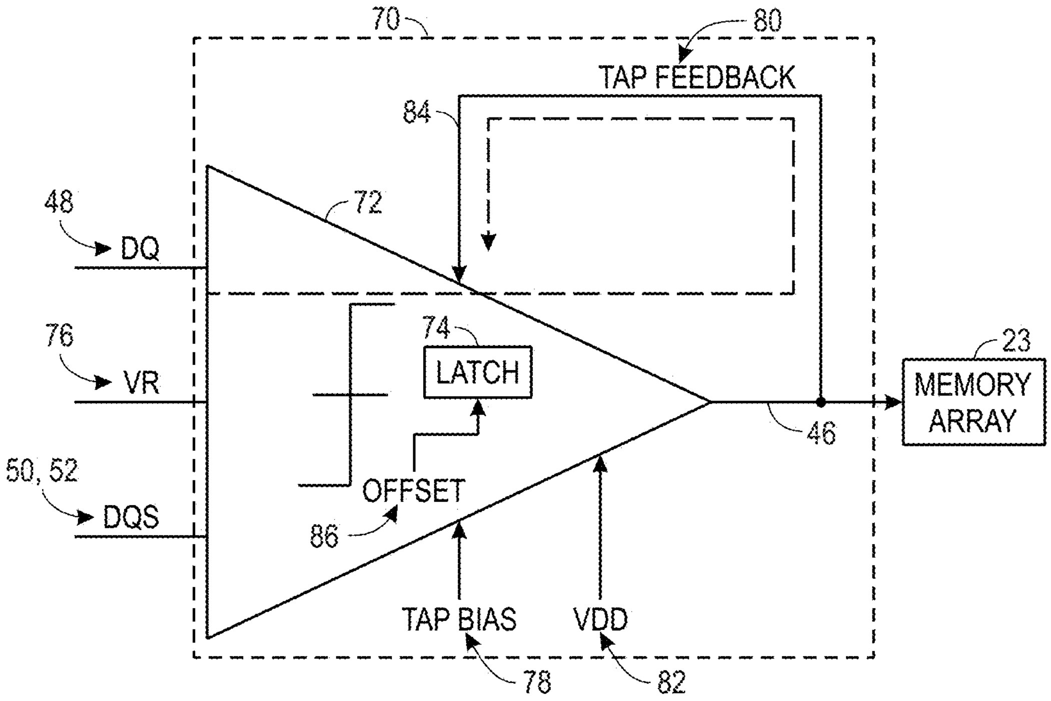
FIG. 2 is a block diagram of a distortion correction circuit of the data transceiver of the memory device of FIG. 1 including a decision feedback equalizer, according to embodiments of the present disclosure.

FIG. 2 illustrates a block diagram of a distortion correction circuit 70 of the data transceiver 44 discussed above and including a DFE 72, according to embodiments of the present disclosure. The DFE 72 may include a latch circuit 74, among other things. The DFE 72 may receive the data 48 (e.g., the DQ signal), the clock signals 50 and/or 52 (e.g., the DQS signal), a reference voltage 76 (e.g., voltage reference or VR), a tap bias voltage 78, a tap feedback 80, and the supply voltage 82 (e.g., VDD).

The DFE 72 and/or the latch circuit 74 may receive the supply voltage 82 to perform operations. The DFE 72 may receive the data 48 by the way of the latch circuit 74. The latch circuit 74 may sense a logic level of data bits of the data 48 being received based on detecting changes to a baseline voltage of the latch circuit 74 compared to the reference voltage 76. The baseline voltage may have a logic level voltage associated with sensing the data 48 by the latch circuit 74. The DFE 72 may output the received data 48 to the memory array 23 via the data bus 46.

A feedback path 84 may return each previously received (and transmitted) data bit (e.g., a data bit n−1) to the DFE 72 as the tap feedback 80. The DFE 72 may combine the tap feedback 80 with the tap bias voltage 78 to generate an offset voltage 86. In some embodiments, the DFE 72 may include a combiner (e.g., a summing amplifier), or any other viable circuit component, to generate the offset voltage 86. The tap bias voltage 78 may correspond to characteristics of the latch circuit 74, the DFE 72, or both. The offset voltage 86 may be proportional to (or inversely proportional to) the ISI and/or distortions of the data 48 caused by the characteristics of the latch circuit 74 and/or the DFE 72 and/or the voltage value of one or more previously received data bits.

The latch circuit 74 may reduce at least a portion of the ISI and/or distortions of the received data 48 based on the offset voltage 86. For example, the latch circuit 74 may combine the offset voltage 86 with the baseline voltage of the latch circuit 74 before sampling the data bit being received. In some embodiments, the latch circuit 74 may include a combiner, or any other viable circuit component, to generate an adjusted baseline voltage by combining the offset voltage 86 with the baseline voltage.

Moreover, the latch circuit 74 may sense a logic level of each data bit (e.g., n−2, n−1, n, n+1, and so on, among other possibilities) being received based on detecting changes to the adjusted baseline voltage, as adjusted based on the offset voltage 86. The latch circuit 74 may sense and/or latch (e.g., hold) the logic level of each data bit being received with reduced ISI and/or distortions. As such, the latch circuit 74 may sample the input data with a reduced propagation delay based on the reduced ISI and/or distortions of the received data 48.

With the foregoing in mind, the latch circuit 74 may receive each data bit of the data 48 during a respective operation cycle of the latch circuit 74. Each operation cycle duration of the latch circuit 74 may correspond to a respective clock cycle duration of the clock signal 50 and/or 52. The latch circuit 74 may include circuitry to combine the offset voltage 86 with the baseline voltage of the latch circuit 74 during a tracking time of each operation cycle. Moreover, the latch circuit 74 may include circuitry to sample the data bit being received during a sampling time of each operation cycle. As mentioned above, the latch circuit 74 may combine the offset voltage 86 with the baseline voltage of the latch circuit 74 before sampling the data bit being received. Accordingly, the latch circuit may have each tracking time before the sampling time during each operation cycle to reduce the propagation delay of each data bit being received during the sampling time.

Figure 3:
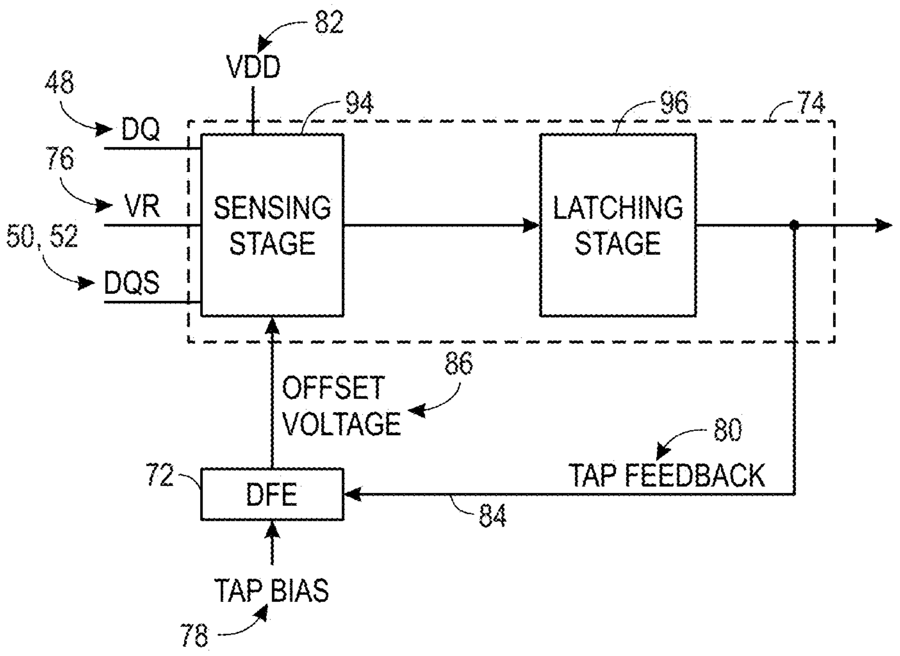
FIG. 3 is a block diagram of the latch circuit of the decision feedback equalizer of FIG. 2 including a sensing stage and a latching stage, according to embodiments of the present disclosure.

FIG. 3 is a block diagram of the latch circuit 74 including a sensing stage 94 and a latching stage 96, in accordance with the present embodiments. The sensing stage 94 may receive the data 48 (e.g., the DQ signal), the clock signals 50 and 52 (e.g., the DQS signal), the reference voltage 76 (e.g., a voltage reference or VR), the supply voltage 82 (e.g., VDD), and the offset voltage 86. The sensing stage 94 may couple to an external circuit providing the data 48, the clock signals 50 and 52, and/or the reference voltage 76. For example, the sensing stage 94 may receive an output voltage of the external circuit. The output voltage of the external circuit may correspond to the data 48. Moreover, the output voltage of the external circuit may transition between voltage values of different data bits of the data 48. The DFE 72 and/or the latch circuit 74 may use the supply voltage 82 to perform at least a part of the operations discussed below.

The sensing stage 94 may sense each data bit of the data 48 during a sampling time of a respective operation cycle of the latch circuit 74. For example, during each sampling time, the sensing stage 94 may compare a data bit being received to the reference voltage 76 to detect and/or amplify a voltage value of the data bit. In some embodiments, the sensing stage 94 may amplify a voltage value of a data bit being received based on a voltage values of the data bit and the transistor types (e.g., n-type transistor or p-type transistor) of the sensing stage 94.

In some cases, if not compensated for, the sensing stage 94 may sense voltage values of each respective data bit of the data 48 during a respective sampling time based on (e.g., at, after) a propagation delay. The propagation delay may correspond to a time for each data bit to propagate through the latch circuit 74 before sensing a voltage value of the data bit. In some cases, a rising edge of the data bit may incline higher than a high sensing threshold at or after the propagation delay during a sampling time. In alternative or additional cases, a falling edge of the data bit may decline lower than a low sensing threshold at or after the propagation delay during a sampling time. The high sensing threshold and the low sensing threshold may be associated with sensing and/or clocking-in a data bit.

As such, the propagation delay of each data bit through the latch circuit 74 may correspond to a time delay for sensing and/or clocking-in each data bit after the start of the respective sampling time. The propagation delay of a data bit through the latch circuit 74 may be associated with (e.g., at least partially caused by) the ISI and/or distortions of the previously received data 48 based on characteristics and/or real-world physical attributes of components and circuitry of the sensing stage 94 and/or the latching stage 96.

As mentioned above, each operation cycle of the latch circuit 74 may include a respective sampling time. Moreover, a duration of an operation cycle of the latch circuit 74 may be based on a duration of the respective sampling time. Furthermore, a duration of a sampling time of an operation cycle may be based on a duration of the propagation delay.

As such, a duration of the sampling time and/or the operation cycle of the latch circuit 74 may be based on (e.g., partially limited by) the propagation delay of each data bit through the latch circuit 74.

To compensate for (e.g., reduce) at least a portion of the propagation delay of the data 48 through the latch circuit 74, the sensing stage 94 may generate the adjusted baseline voltage. In particular, the sensing stage 94 may add the offset voltage 86 to a baseline voltage of the sensing stage 94 to generate the adjusted baseline voltage. Alternatively or additionally, the sensing stage 94 may add the output voltage of the external circuit to the baseline voltage of the sensing stage 94 to generate the adjusted baseline voltage. For example, the sensing stage 94 may generate the adjusted baseline voltage based on a voltage difference between the reference voltage 76 and the offset voltage 86 and/or the output voltage of the external circuit. As such, the sensing stage 94 may determine the adjusted baseline voltage based on the offset voltage 86, the output voltage of the external circuit, and the reference voltage 76.

The sensing stage 94 may generate the adjusted baseline voltage during a tracking time of each operation cycle before the sampling time of the respective operation cycle. In some cases, during the tracking time, the output voltage of the external circuit may transition between voltage values of different data bits of the data 48. Moreover, the offset voltage 86 may compensate for at least a portion of the ISI and/or distortions of the previously received data 48. As such, the sensing stage 94 may reduce a propagation delay of each data bit of the data 48 through the latch circuit 74. Accordingly, the sensing stage 94 may reduce sampling times of the data bits of the data 48 by reducing the propagation delay of the data bits through the latch circuit 74.

With the foregoing in mind, each operation cycle duration of the latch circuit 74 may correspond to a clock cycle duration of the clock signals 50 and/or 52. For example, the duration of the operation cycle may be inversely proportional to a frequency of the clock signal 50 and/or 52. Moreover, reducing the propagation delay of each data bit through the latch circuit may reduce the duration of the sampling time and/or the latch circuit operation cycle. As such, a frequency of the clock signal 50 and/or 52 may be increased above a threshold based on reducing the duration of the propagation delay of each data bit through the latch circuit 74. Accordingly, the sensing stage 94 may sense and/or amplify a voltage value of each data bit based on receiving the clock signals 50 and/or 52 and/or data 48 with a frequency higher than the threshold.

The sensing stage 94 may transmit the sensed and/or amplified voltage value to the latching stage 96. The latching stage 96 may latch (e.g., hold) the sensed and/or amplified voltage value. Moreover, the latching stage 96 may output the received (e.g., latched) data bit to the memory array 23 via the data bus 46 (not shown for simplicity), and to the DFE 72 via the feedback path 84. The DFE 72 may receive the tap bias voltage 78 and each received data bit from the latching stage 96. As mentioned above, the tap bias voltage 78 may correspond to characteristics of the latch circuit 74, the DFE 72, or both.

The DFE 72 may combine the tap feedback 80 with the tap bias voltage 78 to generate the offset voltage 86. The tap bias voltage 78 may correspond to characteristics of the latch circuit 74, the DFE 72, or both. For example, the tap bias voltage 78 may be predetermined for mitigating or reducing the ISI and/or distortions of the received data 48. The sensing stage 94 may receive the offset voltage 86 from the DFE 72. As mentioned above, the sensing stage 94 may combine the offset voltage with the baseline voltage of the latch circuit 74 before sampling the data bit being received. As such, the latch circuit 74 may sense a logic level of each data bit (e.g., n−2, n−1, n, n+1, and so on, among other possibilities) being received based on detecting changes to the adjusted baseline voltage, as adjusted based on the offset voltage 86.

Figure 4:
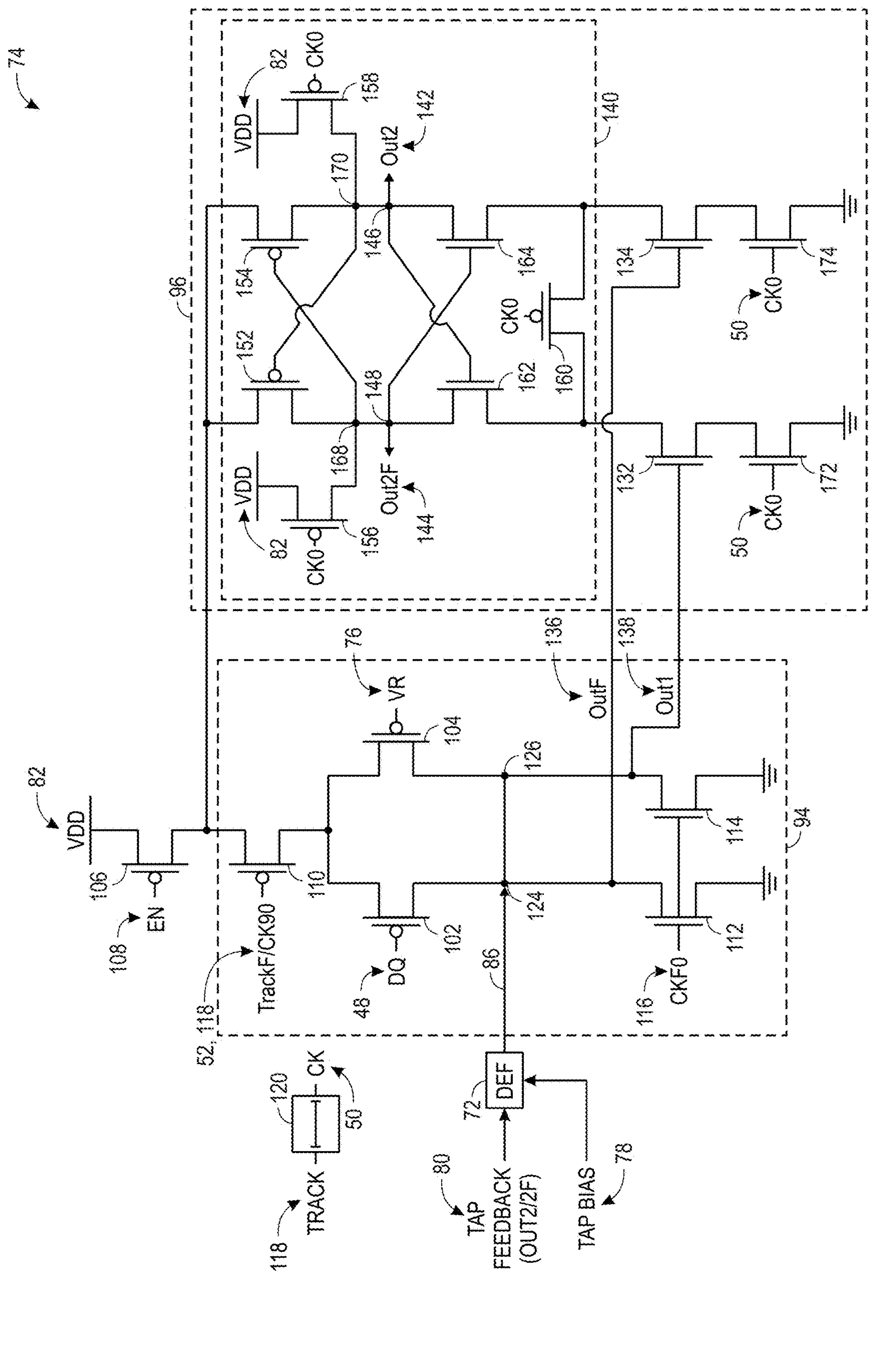
FIG. 4 is a circuit diagram of the latch circuit of FIG. 3 with p-channel input transistors, according to embodiments of the present disclosure.
Figure 5:
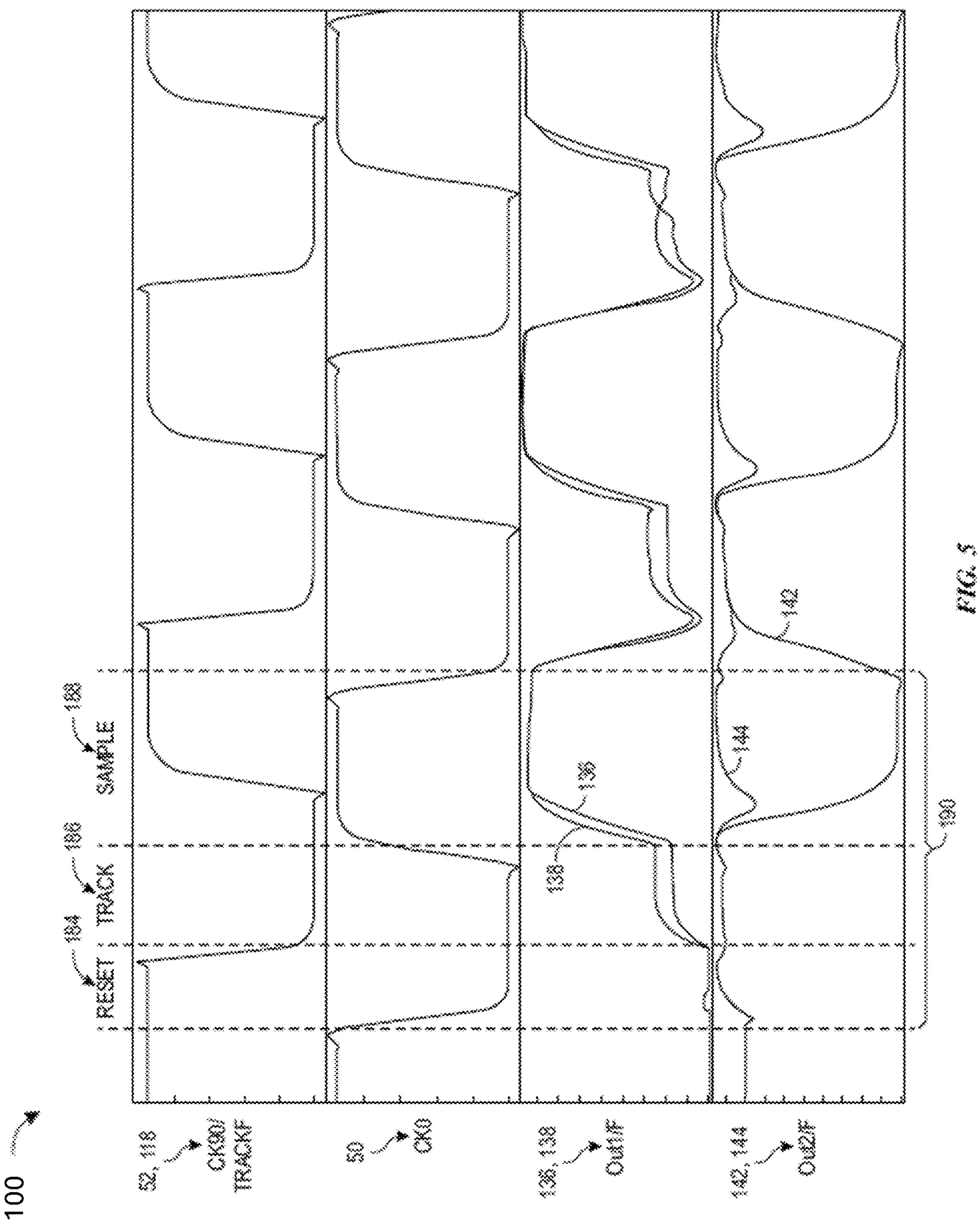
FIG. 5 is a timing diagram of the latch circuit of FIG. 4, according to embodiments of the present disclosure.

FIGS. 4 and 5 are related to the latch circuit of FIGS. 1-3 discussed above. In particular, FIG. 4 is a circuit diagram of the latch circuit 74 with p-channel input transistors 102 and 104, in accordance with the present embodiments. Moreover, FIG. 5 is a timing diagram 100 of the latch circuit 74 of FIG. 4, in accordance with the present embodiments. For example, the latch circuit 74 may be located in the DFE 72, the data transceiver 44, and/or the I/O interface 16 of the memory device 10. The latch circuit 74 may include a comparator or the sensing stage 94 and the latching stage 96.

Moreover, the latch circuit 74 may include a p-channel transistor 106 coupled to a voltage supply, the sensing stage 94, and the latching stage 96. A source of the p-channel transistor 106 may receive the supply voltage 82 (VDD). A gate of the p-channel transistor 106 may receive an enable signal 108 (EN). In the depicted embodiment, the p-channel transistor 106 may output the supply voltage 82, or at least a part of the supply voltage 82, based on the enable signal 108 having a logic low value. The p-channel transistor 106 may output the supply voltage 82 to the sensing stage 94 and the latching stage 96 when the enable signal 108 is low. The sensing stage 94 and the latching stage 96 may sense and latch the data 48 based on receiving the supply voltage 82.

The sensing stage 94 may include the first p-channel input transistor 102, the second p-channel input transistor 104, a p-channel clock transistor 110, and n-channel clock transistors 112 and 114. As mentioned above, the data transceiver 44 may use the clock signals 50 and 52 to sample (e.g., clock-in) the corresponding data 48 for write commands. A gate of the n-channel clock transistors 112 and 114 may receive an inverted version of the in-phase clock signal 50, or an inverted clock signal 116 (e.g., CKF0) having an inverted phase (e.g., 180 degrees, nearly 180 degrees). For example, the gate of the n-channel clock transistors 112 and 114 may receive the in-phase clock signal 50 with a delay equal to (e.g., nearly equal to) half of a clock cycle of the clock signal 50 (e.g., 180 degrees delayed, nearly 180 degrees delayed).

A source of the p-channel clock transistor 110 may receive the supply voltage 82 when the enable signal 108 is low. In some embodiments, a gate of the p-channel clock transistor 110 may receive the quadrature clock signal 52 having a quadrature phase (e.g., CK90). The quadrature clock signals 52 may be 90 degrees (e.g., approximately 90 degrees) delayed compared to the in-phase clock signal 50. The in-phase clock signal 50 and the quadrature clock signal 52 are illustrated in the timing diagram 100 of FIG. 5.

In alternative or additional embodiments, the gate of the p-channel clock transistor 110 may receive a delayed clock signal 118 (e.g., out-of-phase clock signals, TrackF) in lieu of the quadrature clock signal 52. For example, the data transceiver 44 may use (e.g., only use) the in-phase clock signal 50 to sample (e.g., clock-in) the corresponding data 48 for write commands. The data transceiver 44, the DFE 72, and/or the latch circuit 74 may include a delay circuit 120 to generate the delayed clock signal 118 based on receiving the in-phase clock signal 50. The delay circuit 120 may delay the in-phase clock signal 50 by a delay value to generate the delayed clock signal 118. In different cases, the delay circuit 120 may delay the in-phase clock signal by a different value (e.g., 3 degrees, 10 degrees, 17 degrees, 25 degrees, 45 degrees, 52 degrees, 90 degrees, 103 degrees, and so on, among other possibilities) to generate the delayed clock signal 118.

In some embodiments, the memory controller and/or the processor (e.g., an internal or external controller, an internal or external processor, the host, among other things) may select (e.g., dynamically select) the delay value of the delayed clock signal 118. The memory controller and/or the processor may select the delay value during and/or after manufacturing of the latch circuit 74, the data transceiver 44, and the memory device 10. For example, the memory controller and/or the processor may select the delay value based on a frequency of the in-phase clock signal 50 and/or the data 48. By way of example, in the timing diagram 100 of FIG. 5, the delayed clock signal 118 is illustrated as (or over) the quadrature clock signal 52 when having a delay value similar to that of the quadrature clock signal 52 (e.g., 90 degrees, near 90 degrees). It should be appreciated that in other cases, the delayed clock signal 118 may have any other viable delay value.

Referring back to FIG. 4, a gate of the first p-channel input transistor 102 (e.g., an input terminal) may receive the data 48. A gate of the second p-channel input transistor 104 may receive the reference voltage 76. As shown in FIG. 5, each operation cycle of the latch circuit 74 may include a reset time 184, a tracking time 186, and a sampling time 188. During each sampling time 188, the sensing stage 94 may sense a voltage value of a data bit of the data 48 being received by comparing the voltage value of the data bit with the reference voltage 76.

During the reset time 184, the n-channel clock transistors 112 and 114 may be turned on and the p-channel clock transistor 110 may be turned off. In the depicted embodiment, the inverted clock signal 116 may be high (or the clock signal 50 may be low) and the quadrature clock signal 52 may be high during the reset time 184. As such, in the depicted embodiment, a baseline voltage at first node 124 and second node 126 may be adjusted to a reset voltage (e.g., a voltage of the ground terminal (or VSS)) during the reset time 184. In the timing diagram 100 of FIG. 5, the reset time 184 may be a quarter of (e.g., approximately a quarter of) the clock cycle 190. In alternative or additional cases, the reset time 184 may have a different duration and/or may have a different portion of the clock cycle 190.

It should be appreciated that in alternative or additional embodiments, the baseline voltage at the first node 124 and the second node 126 may be reset to a different reset voltage during the reset time 184. For example, in some embodiments, the latch circuit 74 may include p-channel transistors in lieu of the n-channel transistors, and may include n-channel transistors in lieu of the p-channel transistors. In such embodiments, the baseline voltage at the first node 124 and the second node 126 may be reset to a voltage of the supply voltage 82 (or VDD), as the reset voltage, during the reset time 184.

In the depicted embodiments, during the tracking time 186, the n-channel clock transistors 112 and 114 and the p-channel clock transistor 110 may be turned on. In the depicted embodiment, the inverted clock signal 116 may be high (or the clock signal 50 may be low) and the quadrature clock signal 52 may be low. The nodes 124 and 126 may receive the supply voltage 82 through the p-channel clock transistor 110, the first p-channel input transistor 102, and/or the second p-channel input transistor 104. As such, the baseline voltage at the nodes 124 and 126 may be higher than the baseline voltage of the nodes 124 and 126 during the reset time 184 based on receiving at least a portion of the supply voltage 82.

Moreover, the nodes 124 and 126 may receive the offset voltage 86 via the DFE 72. The sensing stage 94 may be pre-charging during the tracking time 186. In some cases, the voltage at nodes 124 and 126 may be pre-charged based on receiving the offset voltage 86 and at least a portion of the supply voltage 82. The sensing stage 94 may generate the adjusted baseline voltage by adding the offset voltage 86 to the baseline voltage during the tracking time 186. During the tracking time, the baseline voltage may correspond to a portion of the supply voltage at the nodes 124 and 126. As discussed above, the offset voltage 86 may compensate for at least a portion of the ISI and/or distortions of the previously received data 48. As such, the sensing stage 94 may reduce a propagation delay of each data bit of the data 48 through the latch circuit 74 during the sampling time 188.

In the timing diagram 100 of FIG. 5, the tracking time 186 may be a quarter of (e.g., approximately a quarter of) the clock cycle 190 after the reset time 184. In alternative or additional cases, the reset time 184 may have a different duration and/or may have a different portion of the clock cycle 190. For example, the sensing stage 94 may receive the delayed clock signal 118 having a different phase compared to the quadrature clock signal 52.

During the sampling time 188, the n-channel clock transistors 112 and 114 may be turned off. When the inverted clock signal 116 is low (or the clock signal 50 is high), the n-channel clock transistors 112 and 114 may be turned off. Moreover, the nodes 124 and 126 may receive the data 48 while having the adjusted baseline voltage based on the supply voltage 82 and the offset voltage 86. A voltage value of a data bit being received may be added to the adjusted baseline voltage during the sampling time 188. As such, the latch circuit 74 may sense a logic level of the data bit being received (e.g., n−2, n−1, n, n+1, and so on, among other possibilities) based on detecting changes to the adjusted baseline voltage compared to the reference voltage 76.

In the depicted embodiment, gates of the n-channel transistors 132 and 134 of the latching stage 96 may be coupled to the nodes 124 and 126. The gates of n-channel transistors 132 and 134 may receive a voltage difference or an amplified voltage difference between the data bit being received and the adjusted baseline voltage during the sampling time 188. That is, the sensing stage 94 may differentially output the sensed data bit, Out1 signal 136 and OutF signal 138, to the latching stage 96 via the nodes 124 and 126. As discussed above, the sensing stage 94 may reduce the ISI and/or the voltage distortions of the data 48 by generating the adjusted baseline voltage during the tracking time 186. Accordingly, the gates of the n-channel transistors 132 and 134 may receive the voltage difference or the amplified voltage difference based on (e.g., at, after) a reduced propagation delay during the sampling time 188.

The latching stage 96 may include a current mirror circuit 140 to differentially output the latched data bits, Out2 signal 142 and Out2F signal 144, via output terminals 146 and 148. The current mirror circuit 140 may include p-channel transistors 152, 154, 156, 158, and 160, and n-channel transistors 162 and 164. Gates of the p-channel transistors 156, 158, and 160 may receive the clock signal 50. Moreover, the p-channel transistors 156 and 158 may be coupled to the supply voltage 82 and a third node 168 and a fourth node 170, respectively.

As mentioned above, the clock signal 50 may be high during the sampling time. As such, the p-channel transistors 156 and 158 may remove the supply voltage 82 from the third node 168 and the fourth node 170 during the sampling time 188. Furthermore, the p-channel transistor 160 may be coupled to the n-channel transistors 162 and 164. Accordingly, the p-channel transistor 160 may uncouple the n-channel transistors 162 and 164 during the sampling time 188.

The current mirror circuit 140 may be coupled to the supply voltage 82 via the p-channel transistor 106. Moreover, the current mirror circuit 140 may be coupled to (e.g., differentially coupled to) the ground terminal via the n-channel transistors 132, 134, 172, and 174. The n-channel transistors 172 and 174 of the latching stage 96 may be coupled to the n-channel transistors 132 and 134, respectively, and the ground terminal. Gates of the n-channel transistors 172 and 174 may receive the clock signal 50. As mentioned above, the clock signal 50 may be high during the sampling time. As such, the n-channel transistors 134 and 174 may be coupled to the current mirror circuit 140 to the ground terminal during the sampling time 188.

With the foregoing in mind, the latching stage 96, including the current mirror circuit 140, may draw a differential current during the sampling time 188. The differential current draw may be proportional to the potential difference between the voltage of the data bit of the data 48 being received and the adjusted baseline voltage during the sampling time 188. The differential current flow due to the discharge of voltage allows the differential voltage between the first node 124 and the second node 126 to increase (e.g., differential gain) relative to the differential voltage between the data bit being received and the adjusted baseline voltage.

That is, the differential voltage is amplified and discharges the voltages at the first node 124 and the second node 126 to the differential voltage (or the amplified differential voltage) at the third node 168 and the fourth node 170. In some embodiments, the latching stage 96 may form a regenerative circuit, creating a full rail (e.g., digital ready) output representative of the amplified data bit received. Accordingly, the data transceiver 44 may sample the data 48 with a reduced propagation delay based on receiving the in-phase clock signals 50 and the quadrature clock signals 52 (or the delayed clock signal 118) with the data 48.

In some embodiments, the latch circuit 74 may operate using a clock signal 50 with a higher frequency compared to latch circuits of other DFEs. For example, the latch circuit 74 may use the clock signal 50 with a higher frequency based on including the p-channel clock transistor 110 to reduce the propagation delay and therefore the sampling time of the latch circuit 74. Moreover, the latch circuit 74 may have a reduced and/or adjustable tracking time compared to latch circuits of other DFEs. For example, the latch circuit 74 may draw electrical current during the tracking time 186 to adjust the baseline voltage based on the offset voltage 86. As such, in some embodiments, the latch circuit 74 may consume reduced electrical power compared to latch circuits of other DFEs based on the reduced tracking time 186 during each operation cycle of the latch circuit 74. Furthermore, the latch circuit 74 may have an adjustable tracking time 186 compared to latch circuits of other DFEs. For example, the latch circuit 74 may draw reduced electrical current during the tracking time 186 based on adjusting the duration of the tracking time by adjusting (e.g., dynamically adjusting) the delayed clock signal 118. As such, in some embodiments, the latch circuit 74 may consume reduced electrical power compared to latch circuits of other DFEs based on the reduced tracking time 186 during each latch circuit operation cycle.

It should be appreciated that although certain electrical components and circuit connections are described, the latch circuit may use alternative or additional electrical components and/or circuit connections in different embodiments. For example, the latch circuit 74 may include a dual-tail latch, among other possibilities. Moreover, any other viable transistor may be used in lieu of each of or any combination of the transistors and/or other components and connections discussed above. That is, although specific embodiments of the latch circuit 74 are discussed above, it should be appreciated that the latch circuit 74 may be implemented using any other viable latch circuit 74, including any other viable components or arrangement of components.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A latch circuit of a decision feedback equalizer comprising:
  a sensing stage configured to:
    receive a first clock signal;
    reset a baseline voltage of the sensing stage to a ground voltage during a first portion of a first clock cycle of the first clock signal;
    adjust the baseline voltage based on a voltage of a first data bit of a plurality of data bits during a second portion of the first clock cycle, wherein the latch circuit previously received the first data bit; and
    sense a voltage of a second data bit of the plurality of data bits during a remaining portion of the first clock cycle; and
  a latching stage coupled to the sensing stage, wherein the latching stage is configured to receive and output the second data bit in response to the sensing stage sensing the voltage of second data bit.

2. The latch circuit of claim 1, wherein the sensing stage is configured to receive a second clock signal, wherein the first clock signal and the second clock signal have a frequency, and wherein a phase of the second clock signal is delayed compared to a phase of the first clock signal wherein the sensing stage is configured to reset the baseline voltage in response to a first clock edge of the first clock signal, adjust the baseline voltage in response to a second clock edge of the second clock signal, and sense the voltage of the second data bit in response to a third clock edge of the first clock signal.

3. The latch circuit of claim 2, wherein the decision feedback equalizer comprises circuitry to generate the second clock signal by delaying the first clock signal.

4. The latch circuit of claim 1, wherein the sensing stage is configured to couple to an external circuit transmitting the plurality of data bits, and wherein the sensing stage is configured to receive a reference voltage, and adjust the baseline voltage further based on an output voltage of the external circuit and the reference voltage.

5. The latch circuit of claim 1, wherein the decision feedback equalizer comprises circuitry to generate an offset voltage by combining a tap bias voltage with the voltage of the first data bit, wherein the sensing stage is configured to adjust the baseline voltage based on the voltage of the first data bit by adding the offset voltage to the baseline voltage.

6. The latch circuit of claim 1, wherein the first data bit is received immediately before receiving the second data bit.

7. A memory device comprising:

a memory array configured to store a plurality of data bits;

a decision feedback equalizer coupled to the memory array, wherein the decision feedback equalizer comprises:

a sensing stage configured to couple to an external circuit transmitting the plurality of data bits and a first clock signal, wherein the sensing stage is configured to:

reset a baseline voltage of the sensing stage to a ground voltage during a first portion of a first clock cycle of the first clock signal;

adjust the baseline voltage based on a voltage of a first data bit of the plurality of data bits during a second portion of the first clock cycle, wherein the decision feedback equalizer previously received the first data bit; and sense a voltage of a second data bit of the plurality of data bits during a remaining portion of the first clock cycle; and a latching stage coupled to the sensing stage and the memory array, wherein the latching stage is configured to receive and output the second data bit to the memory array in response to the sensing stage sensing the voltage of the second data bit.

8. The memory device of claim 7, wherein the sensing stage is configured to receive a second clock signal, wherein the first clock signal and the second clock signal have a frequency, and wherein a phase of the second clock signal is delayed compared to a phase of the first clock signal, wherein the sensing stage is configured to reset the baseline voltage in response to a first clock edge of the first clock signal, adjust the baseline voltage in response to a second clock edge of the second clock signal, and sense the voltage of the second data bit in response to a third clock edge of the first clock signal.

9. The memory device of claim 8, wherein the sensing stage is configured to receive the second clock edge subsequent to the first clock edge, and the third clock edge subsequent to the second clock edge.

10. The memory device of claim 7, wherein the sensing stage is configured to receive a reference voltage, and adjusting the baseline voltage is further based on an output voltage of the external circuit and the reference voltage.

11. The memory device of claim 7, wherein the sensing stage is configured to receive a reference voltage, and sensing the voltage of the second data bit comprises:

adding the voltage of the second data bit to the baseline voltage, as adjusted during the second portion of the first clock cycle, and detecting a voltage difference between the baseline voltage, as adjusted by adding the voltage of the second data bit, and the reference voltage.

12. The memory device of claim 7, wherein the decision feedback equalizer comprises circuitry to generate an offset voltage by combining a tap bias voltage with the voltage of the first data bit, wherein the sensing stage is configured to adjust the baseline voltage based on the voltage of the first data bit by adding the offset voltage to the baseline voltage, wherein the tap bias voltage is predetermined.

13. The memory device of claim 7, wherein the sensing stage is configured to adjust the baseline voltage based on the voltage of the first data bit and a supply voltage of the decision feedback equalizer during the second portion of the first clock cycle.

14. The memory device of claim 7, wherein the decision feedback equalizer is configured to receive and output one data bit of the plurality of the data bits during each clock cycle of the first clock signal, and wherein the first data bit is previously received during a respective clock cycle of the first clock signal preceding the first clock cycle.

15. The memory device of claim 7, wherein the first data bit is received immediately before receiving the second data bit.

16. A latch circuit of a decision feedback equalizer comprising:

a sensing stage comprising:

a first transistor, a gate of the first transistor configured to receive a first data bit and a second data bit;

a second transistor coupled to the first transistor, a gate of the second transistor configured to receive a first clock signal;

a third transistor, a gate of the third transistor configured to receive a reference voltage;

a fourth transistor coupled to the third transistor, a gate of the fourth transistor configured to receive the first clock signal; and a fifth transistor coupled to the first transistor and the third transistor, a gate of the fifth transistor configured to receive a second clock signal, wherein the first clock signal and the second clock signal have a frequency, and wherein a phase of the second clock signal is delayed compared to a phase of the first clock signal;

a latching stage coupled to the sensing stage, wherein the latching stage is configured to receive and output the first data bit and the second data bit in response to the sensing stage sensing the second data bit; and wherein the latch circuit is configured to:

reset a baseline voltage of the sensing stage to a ground voltage during a first portion of a first clock cycle of the first clock signal.

17. The latch circuit of claim 16, wherein the decision feedback equalizer comprises circuitry to generate the second clock signal by delaying the first clock signal.

18. The latch circuit of claim 16, wherein the second transistor is coupled to the first transistor via a first node, the fourth transistor is coupled to the third transistor via a second node, and the latching stage is coupled to the sensing stage at the first node and the second node.

19. A latch circuit of a decision feedback equalizer comprising:

a sensing stage comprising:

a first transistor, a gate of the first transistor configured to receive a first data bit and a second data bit;

a second transistor coupled to the first transistor, a gate of the second transistor configured to receive a first clock signal;

a third transistor, a gate of the third transistor configured to receive a reference voltage;

a fourth transistor coupled to the third transistor, a gate of the fourth transistor configured to receive the first clock signal; and a fifth transistor coupled to the first transistor and the third transistor, a gate of the fifth transistor configured to receive a second clock signal, wherein the first clock signal and the second clock signal have a frequency, and wherein a phase of the second clock signal is delayed compared to a phase of the first clock signal;

a latching stage coupled to the sensing stage, wherein the latching stage is configured to receive and output the first data bit and the second data bit in response to the sensing stage sensing the second data bit; and wherein the latch circuit is configured to:

turn on the second transistor and the fourth transistor, and turn off the fifth transistor to reset a baseline voltage of the sensing stage to a reset voltage during a first portion of a first clock cycle of the first clock signal;

turn on the second transistor, the fourth transistor, and the fifth transistor to adjust the baseline voltage based on a voltage of the first data bit during a second portion of the first clock cycle, wherein the latch circuit previously received the first data bit; and turn off the second transistor and the fourth transistor to sense a voltage of the second data bit during a remaining portion of the first clock cycle.

20. The latch circuit of claim 19, wherein the first portion of the first clock cycle corresponds to the first clock signal and the second clock signal having a logic high value, the second portion of the first clock cycle corresponds to the first clock signal having a logic high value and the second clock signal having a logic low value, and the remaining portion of the first clock cycle corresponds to the first clock signal having a logic low value.

* * * * *